United States Patent [19]

Rapeli

[11] Patent Number: 5,325,075
[45] Date of Patent: Jun. 28, 1994

[54] METHOD AND CIRCUIT ARRANGEMENT TO GENERATE A PHASE MODULATED OR FREQUENCY MODULATED SIGNAL

[75] Inventor: Juha Rapeli, Oulu, Finland

[73] Assignee: Nokia Mobile Phones Ltd., Salo, Finland

[21] Appl. No.: 997,285

[22] Filed: Dec. 23, 1992

[30] Foreign Application Priority Data

Dec. 31, 1991 [FI] Finland ................... 916194

[51] Int. Cl.$^5$ ................... H03C 3/00; H03L 7/18; H03L 7/22
[52] U.S. Cl. ................... 332/103; 332/128; 332/144; 331/16; 375/67
[58] Field of Search ............... 332/100, 103, 104, 105, 332/117, 144, 127, 128; 331/23, 16; 375/67, 120

[56] References Cited

U.S. PATENT DOCUMENTS

| | | | |
|---|---|---|---|
| 3,571,743 | 3/1971 | Menkes | 331/11 |
| 4,994,768 | 2/1991 | Shepherd et al. | 332/127 |
| 5,021,754 | 6/1991 | Shepherd et al. | 331/16 X |
| 5,027,429 | 6/1991 | Kojima | 455/113 |
| 5,053,728 | 10/1991 | Bojl | 332/100 |
| 5,079,520 | 1/1992 | Rapeli | 331/1 A |

FOREIGN PATENT DOCUMENTS

| | | | |
|---|---|---|---|
| 0408238A2 | 1/1991 | European Pat. Off. | H03C 3/09 |
| 0423941A3 | 4/1991 | European Pat. Off. | H03C 3/09 |
| 0423941A2 | 4/1991 | European Pat. Off. | H03C 3/09 |
| 438309A2 | 7/1991 | European Pat. Off. | |
| 916194 | 7/1992 | Finland . | |

Primary Examiner—David Mis
Attorney, Agent, or Firm—Perman & Green

[57] ABSTRACT

The invention relates to a method, in which a phase modulated or frequency modulated signal can be directly generated with a PLL frequency synthesizer. With an interpolating synthesizer it is possible to create a very dense output frequency ($f_x$) raster, so that the pulses received in the phase comparator (63) both from the reference signal ($f_o$) branch and from the voltage controlled oscillator VCO (65) are lengthened in lengthening means (62, 69; 67, 68; $k_1$, L+$\Delta$L; $k_2$, L) by a desired amount. The numbers $k_1$ and $k_2$ are proportional to the amount of lengthening. When these integers now further are changed proportionally to the modulating signal, the change of the integers causes a change of the time difference of the pulses received by the phase comparator (63). This change of the time difference further causes a change in the output signal ($f_x$) of the voltage controlled oscillator. The method is particularly well suited to provide digital quadrature phase modulation QPSK or quadrature amplitude modulation QAM, in which the shift from one carrier phase to another has a predetermined size and waveform as a function of time.

17 Claims, 9 Drawing Sheets

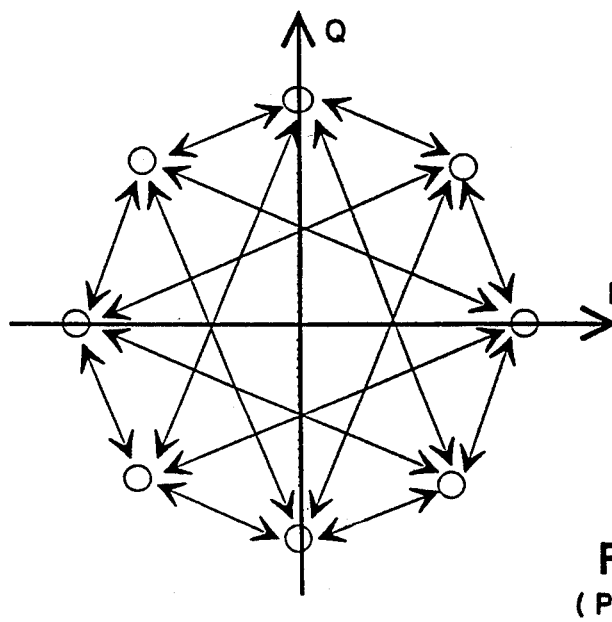
Fig. 3 a
(PRIOR ART)
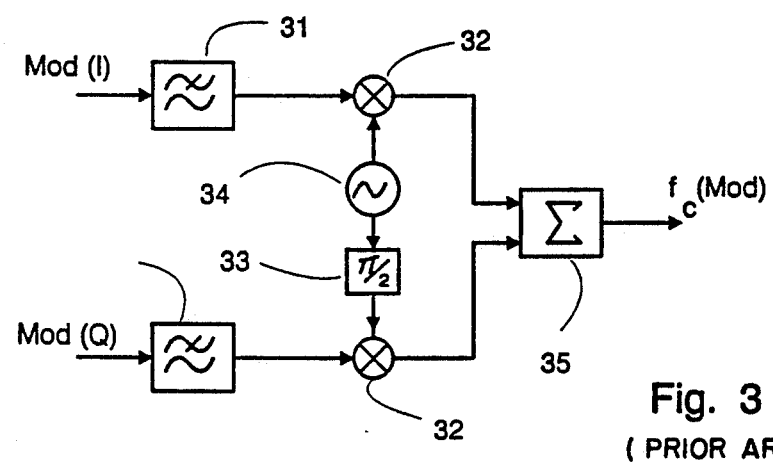
Fig. 3 b
(PRIOR ART)
| SYMBOL | $\triangle \varphi$ |
|---|---|
| 11 | $-3\pi/4$ |
| 01 | $+3\pi/4$ |
| 00 | $\pi/4$ |
| 10 | $-\pi/4$ |
Fig. 4
(PRIOR ART)

METHOD AND CIRCUIT ARRANGEMENT TO GENERATE A PHASE MODULATED OR FREQUENCY MODULATED SIGNAL

FIELD OF THE INVENTION

The invention relates to a method, in which a phase modulated or frequency modulated signal can be directly generated with a PLL frequency synthesizer. The method is particularly well suited to provide digital quadrature phase modulation QPSK or quadrature amplitude modulation QAM, in which the shift from one carrier phase to another has a predetermined size and waveform as a function of time. Applications include radiotelephone systems and the modulation of digital information on an audio frequency or a radio frequency carrier.

BACKGROUND OF THE INVENTION

A frequency synthesizer comprises according to FIG. 2, as is well known, a phase locked loop PLL, which locks the output frequency to a reference frequency. Here the reference frequency and the divided frequency from a voltage controlled oscillator are supplied to a phase comparator, whose filtered output voltage is the control voltage of the VCO. The control voltage controls the oscillator, so that its frequency is locked to the frequency of the signal supplied in the reference frequency branch to the phase comparator.

Analog FM modulation can be obtained in a well known way, shown in FIG. 1, by using a shift oscillator based e.g. on a crystal oscillator 11 having a fixed frequency, which is modulated with the modulating signal Mod, the oscillator having an output $f_{osc(Mod)}$ containing the modulation, which is mixed in the mixer 12 on an unmodulated frequency $f_c$ above or below the carrier. The desired modulated carrier $f_{c(Mod)}$ is filtered from the resulting mixing products with the filter 13. This known method enables modulation with a DC voltage component, but it requires quite much electrical components and therefore it increases the costs of the product, e.g. a radiotelephone. Another well known method according to FIG. 2 is to directly modulate the voltage controlled oscillator VCO of the PLL frequency synthesizer, by adding the modulating voltage Mod to its control voltage $V_{cntrl}$ in an adder 26. A modulation of this kind requires the frequency of the modulating signal to be substantially higher than the cut-off frequency of the filter 24 in the phase lock loop, whereby the phase lock does not return the VCO's phase, and therefore the frequency, back to the situation before the modulation, but the phase retains the offset produced by the modulating signal. It is a very demanding task to realize direct modulation of the VCO, because even a small change in the control voltage $V_{ohj}$ causes a large change in the output frequency $f_c$. For example, if we require that the oscillator in a radiotelephone operating on the 900 MHz band shall have a control range of e.g. 30 MHz, then the modulating voltage, which added to the control voltage supplied by the phase comparator 23 results in a 5 kHz frequency deviation, is only a few millivolts. Further the frequency offset $\Delta f/\Delta V_{ohj}$ of the VCO can vary, even strongly, from one unit to another and at different control voltage values, so that the direct VCO modulation requires calibration of each unit and at each frequency. Further it has to be noted that the PLL frequency synthesis always corrects the frequency to the desired value, whereby modulation with a DC component is not possible.

In principle it is also possible to add a phase shift, which represents the modulation, to the signal directed from the VCO to the phase comparator. Then the phase shift of the oscillator output frequency as a function of time is approximately equal to the step-response of the synthesizer's system function. This phase modulation provided by the control of said phase does not enable a continuous modulation with DC component, because the added phase shift can vary only within a narrow range and because it can only delay the phase.

The above presented known structures can create analog phase modulation by using the time derivative of the phase modulation as frequency modulation, or frequency modulation by using the time derivative of the frequency modulation as phase modulation.

It is known to create and define a digital modulation according to FIG. 3b, so that the carrier supplied by a local oscillator is divided into two components, called the I and Q components having a mutual phase shift of 90 degrees. The modulating information is a bit stream. A symbol comprising one or more bits determines e.g. in QPSK modulation the momentary phase shift of the carrier, or in QAM modulation the momentary amplitude and phase. Thus the symbol rate is equal to or lower than the bit rate. The modulation filters 31 process the bit streams further and supply analog I- and Q-coefficients, which in the multipliers 32 are multiplied with the above said carrier components, which then result in the I- and Q-components of the modulated carrier. These are added in the adder 35 and the modulated carrier thus obtained is transmitted. In other words, we obtain the desired modulation when we regulate the amplitudes of the carrier components having a mutual phase shift, and then add them. Examples of this are the FIGS. 3a and 4, of which FIG. 3a shows a modulation pattern, which uses differential quadrature shift modulation DQPSK. In this modulation a symbol, which comprises two bits and determines the carrier phase shift, is differentially coded: the symbols are transmitted as phase changes in the carrier, so that the symbol is not determined by the carrier's absolute phase, but by the phase change compared to the previous state. The circles on the phase circle's periphery in FIG. 3A represent the carrier phase (and a constant amplitude) for different symbols, and the arrows represent possible phase shifts. Adjacent symbols have a difference of one bit. The table in FIG. 4 shows a symbol comprising two bits and $\Delta\phi$ is the corresponding carrier phase shift. When thus a carrier phase shift of 135 degrees ($3\pi/4$) forward is detected, we know that the received (and transmitted) symbol is 01, and if the phase then changes backwards 45 degrees ($\pi/4$), then the received symbol is 10.

The above presented modulation methods are widely used, despite the mentioned disadvantages. This is due to the shortcomings of known synthesizer arrangements: in the frequency synthesis the phase adjustment accuracy is a whole period of the final frequency generated by the synthesizer, i.e. 360 degrees; and, the smallest adjustable frequency step of the synthesizer has been too large to be used as the frequency deviation.

Commonly assigned patent application (Finland, Jan. 18, 1990) and corresponding U.S. Pat. Nos. 5,079,520, issued Jan. 7, 1992, present an interpolating frequency synthesizer arrangement. The arrangement is based on the fact that the pulses, which both from the reference frequency source and from the VCO via loop dividers are supplied to the phase comparator, are lengthened in delay means by a desired amount, and the pulses are made symmetric. The lengthening of the pulses can not be made as a sliding operation, but the lengthening is made in steps. The lengthening thus means that the frequency of the pulses supplied to the phase comparator also can be regulated to lie between those frequencies, which are obtained when only a loop divider and a reference divider are used, and therefore the synthesizer output frequency raster will be very dense. FIG. 5 shows the basic arrangement of the interpolating frequency synthesizer presented in the application FI-900303, and now the operation of this arrangement is described in general outline. The synthesizer differs from a conventional synthesizer in that a pulse, which has a basic frequency $f_o$ and is divided in the divider 51 by the number M and then supplied to the phase comparator 53, is lengthened in the blocks 52 and 59. Those pulses, which are obtained by dividing the output frequency $f_x$ of the voltage controlled oscillator VCO 55 in the programmable loop divider 56, are also lengthened in the blocks 57 and 58. In the block 59 the basic frequency $f_o$ is multiplied by the number $(L+\Delta L)$, and in the block 58 $f_o$ is multiplied by the number L. In the predivider 56 the frequency $f_x$ of the VCO is divided by the number P and by the number P+1 A times, where A is an integer loaded into the counter A, and in the frequency divider by the number N. In this way the phase comparator 53 receives pulse sequences, which in a balanced state have the frequency $f_o/M$. The pulses supplied to the phase comparator are delayed in the blocks 52 and 57, so that in the block 52 the pulses are lengthened by a time corresponding to $k_1$ lengths of the periods or durations of delay pulses generated by the block 59, and in the block 57 the pulses are lengthened by a time corresponding to $k_2$ lengths of the periods or durations of the delay pulses generated by the block 58. The coefficients $k_1$ and $k_2$ are updated for each pulse, so that we obtain symmetrical pulses, which are supplied to the phase comparator. It can be shown that then the following formula applies to the output frequency $f_x$ of the VCO 55:

$$f_x = \frac{f_o \cdot (NP + A)}{M + \frac{k_1}{L + \Delta L} - \frac{k_2}{L}} \quad (1)$$

Here we see that the output frequency of the synthesizer can be changed in small increments by changing the numbers $k_1$ and $k_2$. The numbers $k_1$, $k_2$, L and $\Delta L$ are integers, and generally $\Delta L=1$.

SUMMARY OF THE INVENTION

The object of the invention is to provide a modulating synthesizer arrangement, in which the voltage controlled oscillator's output frequency is a carrier, which is directly frequency modulated or phase modulated. Because it is necessary to use a very dense frequency raster in a synthesizer of this kind, the invention is based on prior art presented in said application FI-900303, whereby the method presented there is extended to solutions providing the modulation. The modulating synthesizer arrangement is characterized by what is said in claim 1.

Thus the basic realization of the invention is that it is possible to use a frequency synthesizer based on said FI-application also for frequency or phase modulation in such a way, that the modulation is supplied in digital form to the PLL loop, and that during the whole time of modulation the PLL synthesizer is in a phase locked state, whereby the modulation is accurate and controlled. This is not possible in methods using direct modulation of the VCO. When the arrangements to be used are realized in ways described further below, then it is possible to provide an accurate PSK modulation. The controllability of the modulation can be further improved according to the embodiment of claim 6. Since the output frequency of the synthesizer used in the invention is determined by the length of the delay of the pulses supplied to the phase comparator, whereby the delay is realized by programmable changing the coefficients which determine the delay, then these coefficients can be changed proportionally to the modulating signal. When a frequency modulation is desired, then the coefficients are changed so that the output frequency of the synthesizer changes in accordance with the modulating signal's change; and when a phase modulation is desired, then the coefficients are changed so that the output frequency of the synthesizer does not change, but so that there is a change in the output signal's phase, the change having a defined size and corresponding to the allowed phase shifts in the desired angle modulation method. The phase change is based on the feature of a phase locked loop, in which, when the pulses supplied to the phase comparator from both the VCO and the reference branch are delayed by unequal amounts, then the VCO output frequency still is the same, but it now has a phase shift which is proportional to the difference of said delays.

BRIEF DESCRIPTION OF THE DRAWINGS

The invention is described in more detail with the aid of the enclosed figures, in which:

FIG. 3a shows the digital modulation pattern used in a mobile phone system;

FIG. 3b is a known arrangement to realize the modulation;

FIG. 4 is a table relating to the pattern of FIG. 3a and showing the symbol combinations and corresponding carrier phase shifts;

DETAILED DESCRIPTION OF THE INVENTION

The contents of FIGS. 1-4 was already above described in connection with the prior art, so here they are not further examined. The invention is described with further reference to FIG. 5, according to which the pulses supplied to the phase comparator 53 are delayed proportionally to the reference frequency $f_o$. If now the phase of the signal directed from the VCO 55 via dividers 56 to the phase lock is shifted with the means 57 and 58 by the amount $\Delta t$, then the phase of the VCO's output frequency is shifted with the same amount $\Delta t$. This phase shift, as a function of the time, is approximately equal to the step-response of the synthesizer's system function, in other words, the phase shift of the output frequency is not step-like. This is an advantage, because in digital modulation the carrier phase shift must not step-like, but the change must have a certain waveform as a function of the time.

Figure 1:
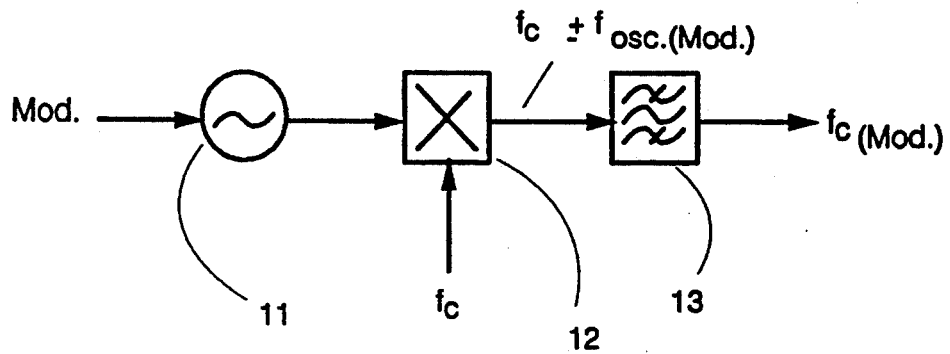
FIG. 1 shows a prior art modulation method based on a shift oscillator.
Figure 2:
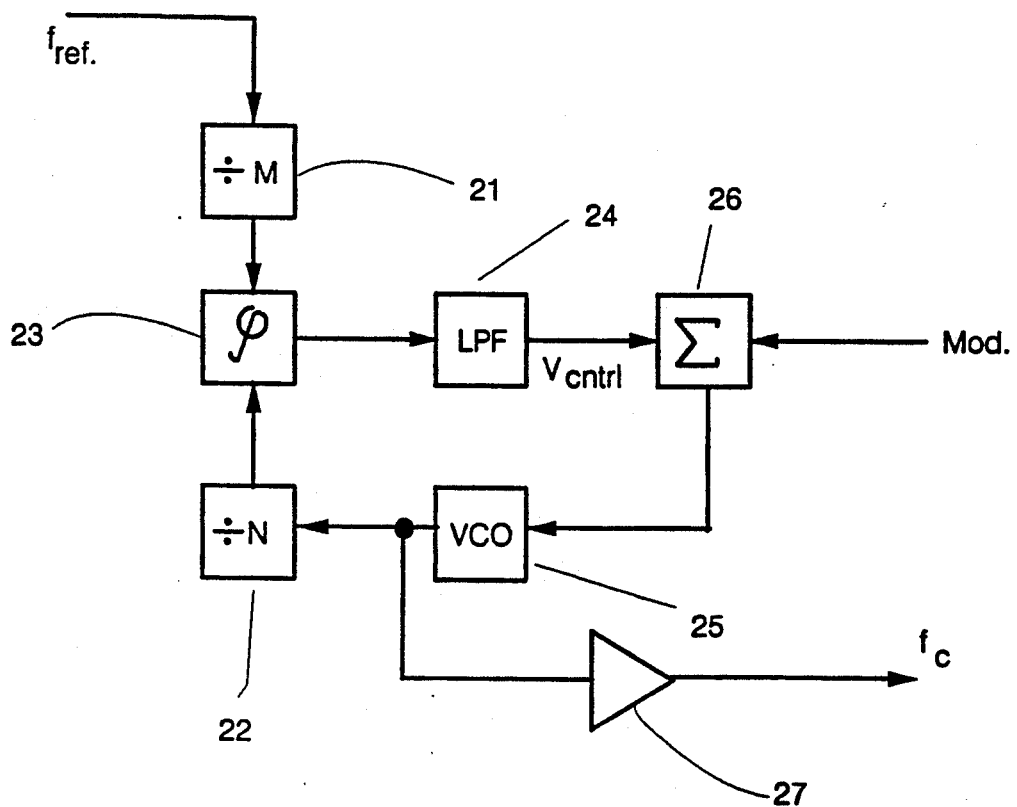
FIG. 2 illustrates prior art direct modulation.
Figure 5:
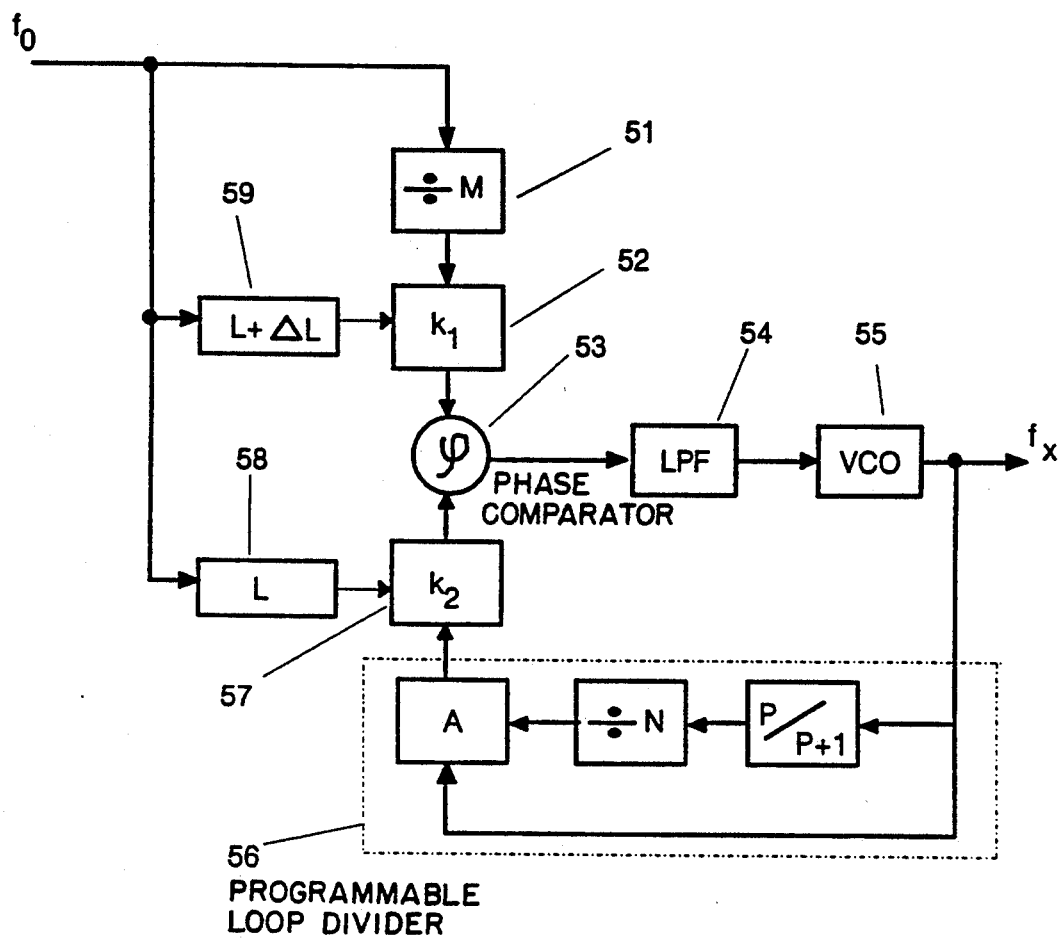
FIG. 5 is a schematic basic arrangement of an interpolating frequency synthesizer.

In FIG. 5 it is shown that the pulse lengthening in the reference frequency branch is proportional to pulses with the L-frequency. Further for the sake of simplicity we assume that $\Delta L=1$. According to the above, when the pulses to the phase comparator in the reference frequency branch are lengthened with $k_1$ units of the pulse duration with frequency $(L+1)f_o$, then we have $$\Delta T_1 = k_1/[f_o(L+1)] \qquad (2)$$

and in a corresponding way we get the delay in the VCO branch $$\Delta T_2 = k_2/[f_o L] \qquad (3)$$

If both numbers $k_1$ and $k_2$ at a certain moment are changed by a value K, there is a change in the time difference of the signals supplied to the phase comparator 3

$$\Delta T = \frac{K}{f_o} \cdot \left( \frac{1}{L} - \frac{1}{L+1} \right) \qquad (4)$$

Then a phase difference is created in the output frequency $f_x$ $$\Delta\phi = 2 \cdot \pi \cdot \Delta T \cdot f_x \qquad (5)$$

Here we can see the realization of the invention, that when the modulating symbol is coded as numbers $k_1$ and $k_2$, then a direct phase modulation can be provided. If the reference frequency $f_o$ is e.g. 12,8 MHz, L=63, and K=1, then we obtain the time difference $\Delta T=19,4\cdot 10^{-12}$s, when the values are substituted in the equation. As was mentioned above, this time difference appears as a corresponding phase shift in the VCO's output frequency, and in a signal on 900 MHz this corresponds to a phase shift of 6,28 degrees. If the numbers $k_1$ and $k_2$ are changed by numbers other than one, then correspondingly we obtain output signal phase shifts of different sizes, being multiples of said 6,28 degrees. Here we realize that the desired phase shifts can be directly programmed by programmable adding or subtracting a desired amount of numbers $k_1$ and $k_2$ during the pulse supplied to the phase comparator. During one period of an $f_o$-pulse at the basic frequency, L+1 pulses are supplied by the block 59 to the block 52, and L pulses are supplied by the block 58 to the block 57, and therefore these numbers at the same time represent the upper limits for the numbers $k_1$ and $k_2$. If said numbers after addition or subtraction would be outside the number ranges [1, L] and [1, L+1], then it is arranged in the reference divider 51 (M) or in the loop divider 56 to add or subtract one pulse, and thus the numbers $k_1$ and $k_2$ cyclically are returned to their own number ranges.

Because an arbitrary frequency raster can be realized by the interpolating frequency synthesizer used in the invention, the frequency of the pulses supplied to the phase comparator 53 is preferably arranged to be identical with the symbol rate, or a multiple of the symbol rate, of the telephone system in use, whereby it is possible to have a direct modulation at the symbol rate. Using the arrangement of FIG. 5 we obtain with the phase modulation a phase shift, according to expression (5), which is proportional to the synthesized output frequency $f_x$, and thus it is not constant at different values of $f_x$. This is due to the fact, that the reference frequency $f_o$ is supplied to the means 58 and 59, which determine the delay of the pulses supplied to the phase comparator.

Figure 6:
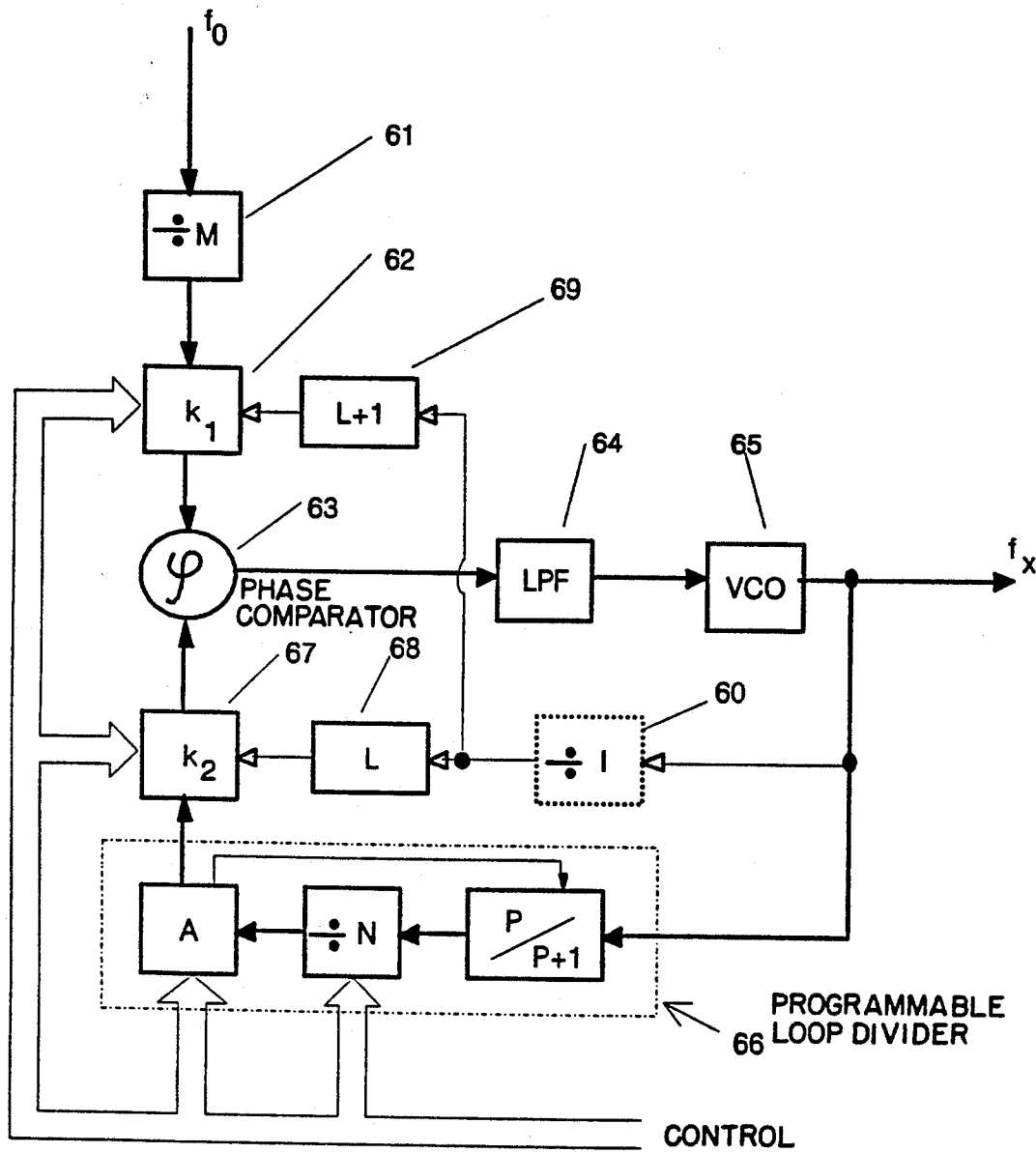
FIG. 6 shows a second embodiment, in which the pulses supplied to the phase comparator are delayed proportionally to the synthesizer output frequency.

FIG. 6 shows a second embodiment. Basically it differs from the embodiment of FIG. 5 in that, instead of the reference frequency, the loop output frequency $f_x$ is supplied to the multipliers 68, 69 whereby $f_x$ may be divided by the integer I in the divider 60. The output frequency $f_x$ is divided by the integer I and supplied to the multipliers 68 and 69 before the delay means 62 and 67. The pulses supplied to the phase comparator 63 are delayed proportionally to the output frequency $f_x$. When the numbers $k_1$ and $k_2$ are changed by the number K, the pulse edge in the reference branch arrives at a moment, which is shifted by the amount $$\Delta T_1 = KI/[f_x(L+1)] \qquad (6)$$

Correspondingly the pulse edge in the VCO-branch arrives at a moment, which is shifted by the amount $$\Delta T_2 = KI/[f_x L] \qquad (7)$$

These are shifts with respect to the balanced state. When the numbers $k_1$ and $k_2$ are changed by the number K, then analogous to equation (4) we have for the delay difference between the pulses supplied to the phase comparator $$\Delta T = \frac{K \cdot I}{f_x} \cdot \left( \frac{1}{L} - \frac{1}{L+1} \right) \qquad (8)$$

This causes a phase difference of the output frequency $f_x$ $$\Delta\phi = 2 \cdot \pi \cdot \Delta T \cdot f_x \qquad (9)$$

in other words, we can see that in the embodiment of FIG. 6 it is possible to modulate the output signal of the synthesizer in such a way that it will have a phase shift, which is independent of the output frequency, and when the value of expression (8) is substituted in expression (9) we get the phase shift $$\Delta\phi = 2 \cdot \pi \cdot KI/[L \cdot (L+1)] \qquad (10)$$

where K is an integer. This means that the phase circle of totally 360 degrees can be divided into J parts, where $$J = L \cdot (L+1)/I \qquad (12)$$

Accordingly, if the delay coefficients $k_1$ and $k_2$ are updated at each pulse arriving to the phase comparator, then the length of the pulse coming from the reference branch to the phase comparator is $$T_1 = M/f_{ref} = I/f_x * k_1/(L+1) \qquad (12)$$

and correspondingly the length of the pulse coming from the VCO-branch is $$T_2 = (NP+A)/f_{ref} + I/f_x * k_2/L \qquad (13)$$

In a balanced state we have $T_1 = T_2$, and then we correspondingly obtain the output frequency $$f_x = f_{ref}/M * [NP + A + I*(k_2/L - k_1/(L+1))] \qquad (14)$$

in other words, here we see that in frequency modulation we can realize, by varying $k_1$ and $k_2$, the frequency shift or the deviation $$\Delta f = I f_{ref}/M [k_2/L - k_1/(L+1)] \qquad (15)$$

is independent of the output frequency $f_x$.

Let us take as an example the above value $L=63$, and $I=16*L$, i.e. $I=1008$. Then the value of J is according to equation (11) $J=4$, i.e. with these parameters the arrangement would realize the generally known QPSK modulation. With smaller values of I, the arrangement in a very simple way realizes multilevel digital PSK modulations, which generally are considered difficult.

Figure 10:
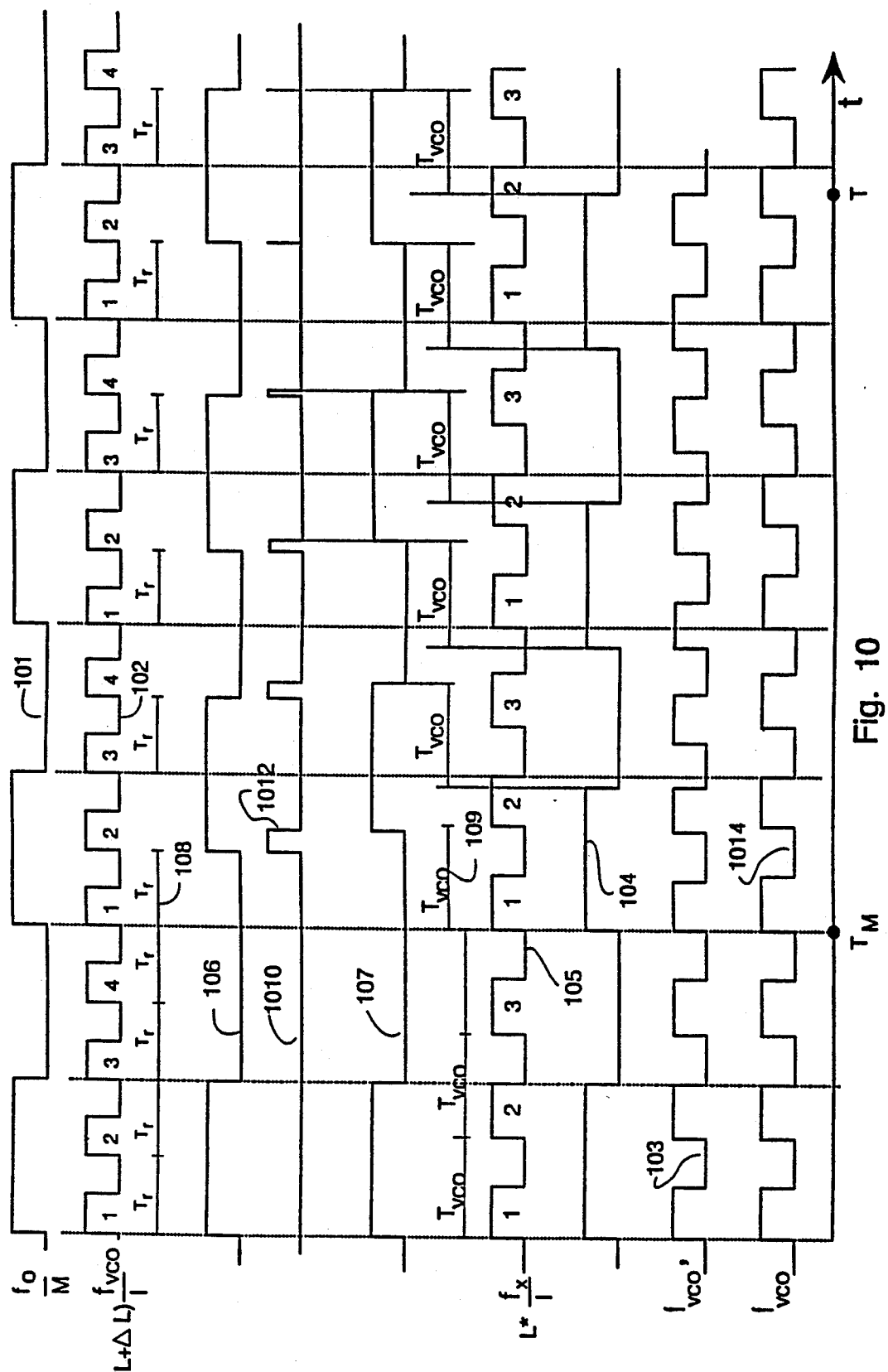
FIG. 10 shows a pulse diagram of the embodiment of FIGS. 5 and 6.

The said phase modulation is shown as a pulse diagram in FIG. 10. There the line 101 represents the reference frequency divided by the divider M, and the line 102 represents the frequency $(L+\Delta L)*f_{VCO}/I$, where $L=3$ and $I=3$. For the sake of simplicity and for the illustration the numbers L, J, $P_oN+A$ are selected as the lowest possible numbers. The line 103 represents the VCO frequency and the line 104 represents the frequency of the VCO (65, FIG. 6) divided by the number $P_oN+A$. The line 105 represents the frequency $L*f_{VCO}$, where $L=3$ and $L+\Delta L=4$. We must note that the frequencies controlling the delay are not direct multiplication results of the frequency $f_{VCO}/I$, but in a way characteristic to the invention they are formed by a number of L and (L+1) delays, the total length of which are controlled to be a period duration corresponding to the frequency $f_{VCO}/I$. Because the delay means 62 and 67 in FIG. 6 comprise e.g. unit delays, the leading and trailing edges are always exactly delayed with the desired amount, but they are not delayed to the position of any nearby clock edge. Thus the lines 102 and 105 and the numbers written below them represent the length of the delay in the delay means and its cyclic nature, which is utilized in the description below. Let us assume a delay $T_R$ corresponding to the frequency $(L+1)*f_{VCO}/I$, and a delay $T_{VCO}$ corresponding to the frequency $L*f_{VCO}/I$, as is shown in FIG. 10 by the reference numerals 108 and 109.

To begin with the phase lock is in balance, whereby the pulses 106 and 107 arriving at the phase comparator 67, FIG. 6, have the same frequency and the same phase. At the moment $T_M$ 1011, FIG. 10, the modulation is created by delaying the signal 101 in the reference branch by the amount $T_R$, and the signal 104 in the VCO branch is delayed by the amount $T_{VCO}$, whereby the signals 106 and 107 arriving at the phase comparator have phases that differ in the way shown by the expression (8). The phase comparator 67, FIG. 6, now detects the phase difference 1012, which in a way known for a PLL synthesizer changes the momentary frequency of the VCO, until the phase of the VCO frequency is shifted by the amount of the programmed change. In FIG. 10 this occurred at the point of time 1013. The line 1014 in FIG. 10 represents the VCO frequency in the case, where no modulation was programmed at the moment $T_M$. Here we see, that the size of the programmed phase change was one quarter phase. This is obvious, since using the numbers of the example the phase circle is divided into four parts, because $L*(L+1)/I=4$, and the programmed change was the smallest possible change. When the numbers $k_1$ and $k_2$ are selected in a suitable way it is possible to shift the phase of the VCO frequency further forwards or backwards.

Figure 8:
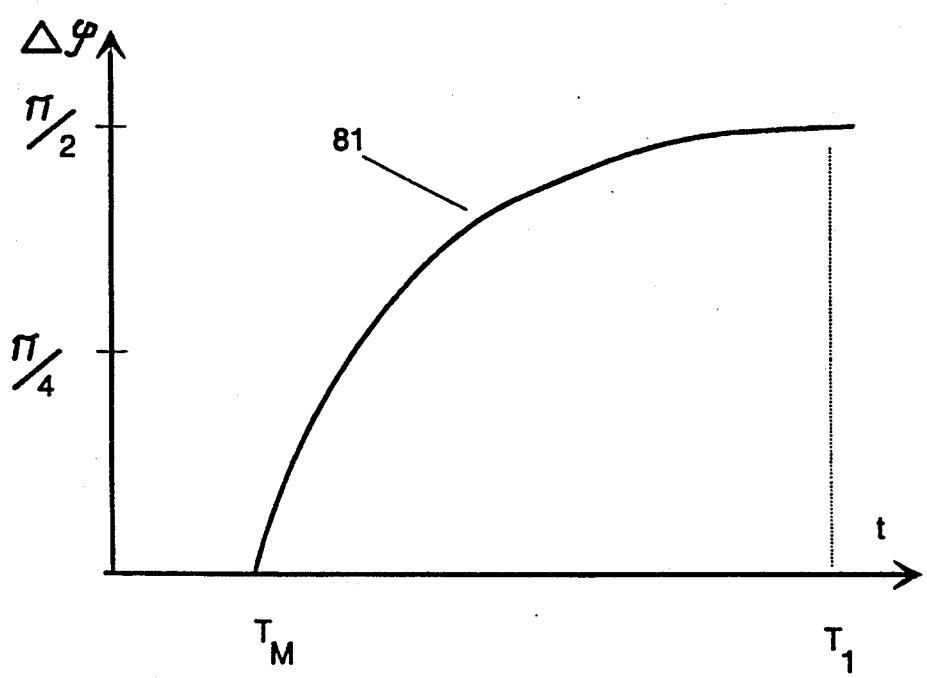
FIGS. 8a and 8b show the transient overshoot of the modulation.
Figure 8:
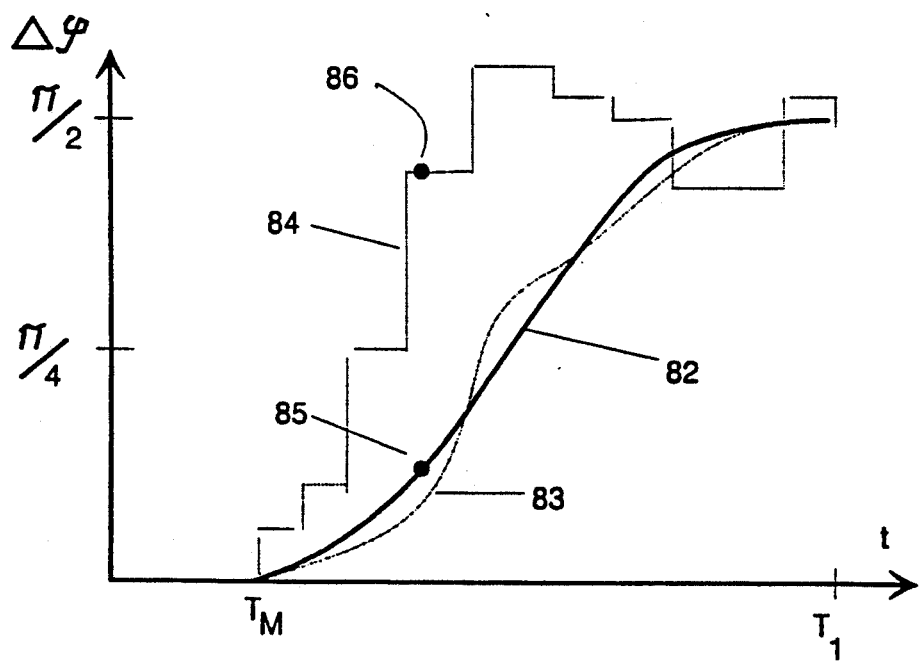

As is seen in FIG. 10, the PLL loop gradually realizes the programmed phase or frequency modulation as a step-response of the control loop transfer function. In order to realize the frequency spectrum required of the modulation, the shift from one phase or frequency to another must be realized according to predetermined waveforms. Such a situation is considered in FIGS. 8a and 8b, in which the graph 81 of FIG. 8a represents how the above quarter-wave ($\pi/2$) phase shift is realized as a function of time. FIG. 8b shows a case, in which we require the same synthesizer to have a shift from one phase to another according to the unbroken graph 82. When the control of the phase modulation is realized piece by piece in several steps according to the dotted line 84 of FIG. 8b, we can have a phase shift as a function of time, which fulfills the presented requirements within the limits of the allowed error. It is possible to use this same method also to increase the speed of the frequency change, so that the cut-off frequency of the loop filter is set to a low value in order to attenuate noise, and fast changes are realized by controlling the synthesizer to have an overshoot.

Figure 7:
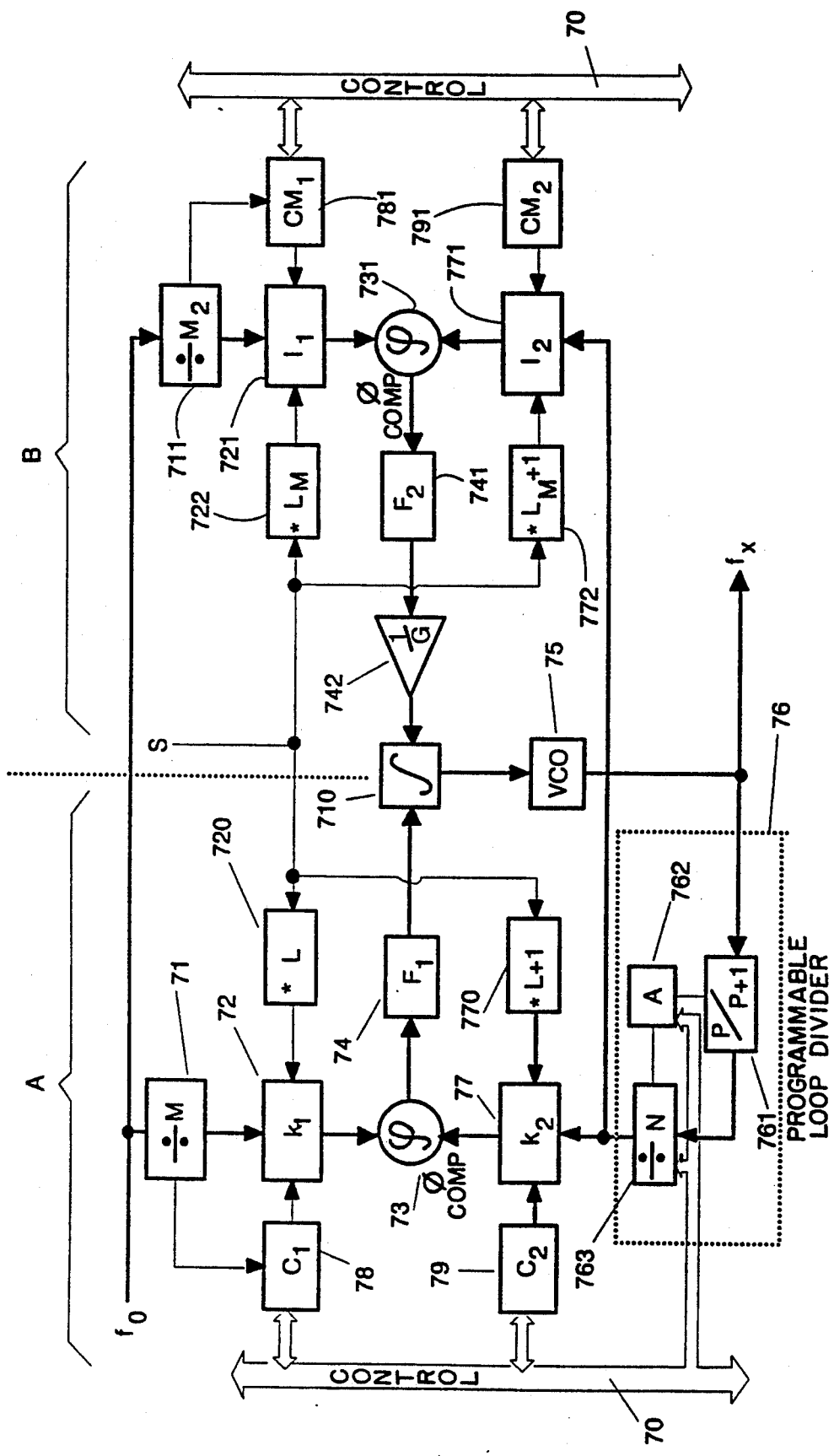
FIG. 7 shows a third embodiment, in which control of the modulating signal and control of the frequency are separated.

The profile of the frequency or of the phase change, such as the dotted line 83, is realized in the modulation control means $CM_1$ and $CM_2$, 781 and 782 in FIG. 7, in which said change is stored in a memory, such that only the size, direction, and possibly the point of time, of the desired phase shift or frequency shift are required for the control.

It is very simple and easy to realize the digital phase modulation according method described in connection with FIGS. 5 and 6. On the other hand it can be difficult to realize an analog phase or frequency modulation by the direct modulation method with the described means, since it might require a non-realistically large L-value to realize frequency shifts, which are of the order of one Hertz, or phase shifts, which are of the order of a fraction of a degree. According to the third embodiment of the invention it is possible to increase the phase or frequency accuracy by splitting the synthesizer into two parts: one part generating the basic frequency and phase, and the other part providing the modulation. This embodiment is illustrated by the diagram in FIG. 7, in which the synthesizer part A generates the basic frequency and phase, and the synthesizer part B provides the modulation.

The function of part A is known through the above described functions of the structures in FIGS. 5 and 6. The part A could also be a digital PLL synthesizer according to prior art, in which no pulse lengthening then is provided.

Part B has control means 781 and 791 to provide the modulation, and these means receive the modulation signal information on the bus 70, which also provides the information to the control means 78 and 79 (C1; C2) of the pulse lengthening means in part A. According to this embodiment of the invention the parts A and B are connected in parallel, so that they have a common VCO 75 and predivider 76 in the VCO branch, and so that the VCO control voltage of part B is attenuated in the attenuator 742 by the coefficient G and then added to the VCO control voltage of part A. The reference frequency $f_o$ is common for both parts A and B, and the frequency 712 supplied to both pulse lengthening means (72, 720, 77, 770 in part A; 721, 722, 772, 772 in part B) is denoted by the letter S. This frequency can be the reference frequency or the output frequency $f_x$ of the loop. Both parts have control means C1, C2, CM1, CM2 for the control of the pulse lengthening means. The loop of both parts is thus in principle according to FIG. 5 or FIG. 6. Let the balanced state frequency in part A be $f_{xA}$ and the balanced state frequency in part B be $f_{xB}$, calculated according to formula (1) or (14). We can show that in an arrangement according to FIG. 7 the balanced state frequency $f_x$, i.e. the output frequency of the synthesizer, is $$f_x = f_{xA} + (f_{xB} - f_{xA})G \qquad (16)$$

Here we can see that the deviation of the frequency programmed in the part B compared with the frequency of part A appears in the output frequency divided by G, and correspondingly it is possible to perform the modulation in part B so that it is a multiple of G, and thus we obtained a very good accuracy for the modulation of both the frequency and the phase. Further the parts A and B of FIG. 7 can have different filter functions F1 and F2, corresponding to the need that the proper carrier is changed in part A in accordance with the telephone's transmit channel only at certain time intervals and by frequency steps of a certain size, whereas the modulation in part B is continuous and its rate of change can be high. Thus the loop of part A can be slow and have a very low noise, whereas the loop of part B must be very fast in order to keep it locked during the whole modulation performance. This imposes different requirements on the loop filters. The required integration in the PLL loop is performed after the addition, as a part of the means 710.

Now we will describe in detail the function of the arrangement in FIG. 7 regarding frequency modulation. The synthesizer comprises a reference branch, in which the reference frequency $f_o$ is divided by the number M in the divider 71, the output pulse of which in the means 72, controlled by the control means 78, is lengthened by a time, which corresponds to $k_1$ pulses with the frequency $(L+\Delta L)*f_o$, and so that when the pulse lengthening exceeds the edge of the pulse cyclically supplied by the divider 71, the means 78 controls the counter 71 to delay one whole pulse and thus returns the number $k_1$ to the integer range $[0, L+\Delta L]$. The VCO branch has a corresponding function. The phases of the pulses directed to the phase comparator 73 via the VCO branch and the reference branch are then compared in this comparator, the difference signal is integrated and filtered in filter 74, and directed as a control voltage to the VCO 75. The output frequency $f_x$ of the VCO is the desired output frequency.

When part A is in a balanced state we have a frequency $f_x$ according to formula (1)

$$f_{xA} = \frac{f_o \cdot (NP + A)}{M + \dfrac{k_1}{L + \Delta L} - \dfrac{k_2}{L}}$$

Let us assume that both parts A and B in the balanced state have the frequency $f_x$, whereby the phase comparator 731 of the part B supplies to the VCO a zero control voltage via the loop filter 741, the attenuator 742, and the adder 710. In order to further simplify the description we assume that the parameters of the parts A and B are identical. According to FIG. 1 part B is in a balanced state when $$f_{xB} = \frac{f_o \cdot (NP + A)}{M_2 + \dfrac{l_1}{L + \Delta L} - \dfrac{l_2}{L}}$$

and we have a balanced state when $l_1 = k_1$ and $l_2 = k_2$. If we now increase the coefficients $l_1$ and $l_2$ in part B by one, then the balanced frequency of part B would decrease by one frequency step. However, this does not occur, because part A tries to keep the frequency as it was. We can show that the new balanced state is such, in which the change in the VCO control voltage directed to the adder 710 has the opposite direction but the same size as the change in the VCO control voltage, which is received from part B attenuated by the coefficient G, and is thus according to formula (16).

The real advantage of the embodiment according to FIG. 7 is obtained in that, when a phase or frequency shift is performed with the aid of phase delay means 721 and 771, the change of the output frequency $f_x$ is always modulated on the VCO and is exactly of the desired size. In practice, however, both parts A and B of the synthesizer react to the programmed frequency or phase shift with their own time constants, so that the final value always exactly settles at the desired value. Further it is possible to increase or decrease the rats of change of the frequency or phase by programming the change piece by piece into the means 781 and 791 (CM1, CM2) controlling the synthesizer, so that during the change a value 86 smaller or larger than the momentary target value 85 shown in FIG. 8b is programmed with the aid of these means, whereby the actual value is very accurately the desired value, due to the synthesizer time constants, which delay the change.

Figure 11:
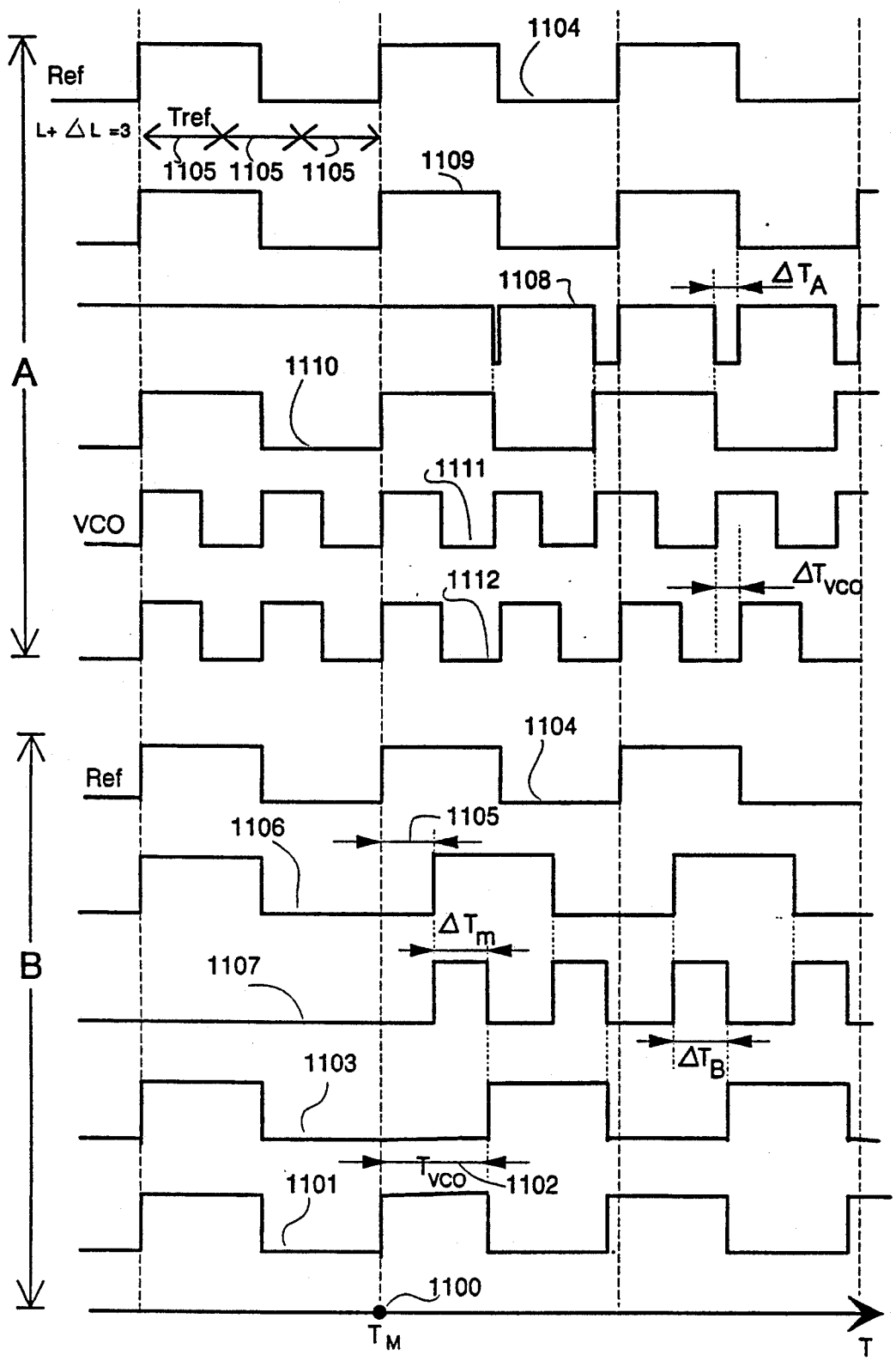
FIG. 11 shows the operation of the phase modulator according to FIG. 7 as a pulse diagram.

The operating principle of the arrangement according to FIG. 7 is shown as a pulse diagram in FIG. 11, having the same parameters as FIG. 10, and further $G=2$, $L=L_M=2$, and to start with $l_1=k_1$ and $l_2=k_2$. The situation at the beginning is selected so that the delay coefficients are zero and the whole synthesizer arrangement in balance, which means that the output signals of the phase comparator 73 in part A and the phase comparator 731 in part B do not indicate any phase difference. This situation lasts until the moment Tm (1100), when a phase shift is programmed into part B so that both the supplied signal 1101 in the VCO branch is delayed by the time $T_{VCO}$ (1102) to result in the delayed signal 1103, and the signal 1104 in the reference branch is delayed by the time $T_{ref}$ (1105) to result in the delayed signal 1106. Then the part B phase comparator 731 has an output signal 1107, in which a signal over the zero level corresponds to a positive phase difference between the signal 1103 in the VCO branch and the signal 1106 in the reference branch. During the modulation performance the VCO phase is advanced so that the phase comparator 73 output signal 1108 in part A will indicate a phase difference $\Delta T_A$, which has the opposite direction compared to part B, and which is equal to $\Delta T_B$ divided by G, $\Delta T_B$ being the phase difference detected by the phase comparator 731 of part B. In FIG. 11 we can see that in part A the phase of the signal 1109, which is supplied to the phase comparator from the reference branch, is retarded compared to the phase of the signal 1110 in the VCO branch. Thus in the balanced state the sum of these is zero, and the VCO signal 1111 has deviated from the programmed value by the fraction 1/G, which is seen as the phase difference $\Delta T_{VCO}$ between the modulated VCO signal and that VCO signal, line 1112, which is assumed to be unmodulated. The programmed phase shift has a length of $\Delta T_M$, and the phase shift realized in the VCO is $\Delta T_M/G$.

The frequency modulation is created by continuously performing phase shifts of the type above. The feasibility of the arrangement is increased by the fact, that to a very high degree the parameters of parts A and B may be selected independently of each other.

The fact, whether the arrangement in FIG. 7 will realize a frequency modulation or a phase modulation, which is accurately controlled and independent of the output frequency, can be selected when we take a frequency derived from the reference frequency $f_o$ to be the input signal 712 (S) of the multipliers 720, 722, 770 and 772, whereby the size of the frequency or phase step depends on the output frequency $f_x$, or when we take a frequency, which is derived from the output frequency $f_x$ and divided in a particular way by the integer I to be the input signal S, whereby the sizes of both the frequency step and the phase step are according to the formulas (10) and (14) and independent of the output frequency $f_x$. It is simpler to derive the delay pulses from the frequency $f_o$ than to derive them from the frequency $f_x$, because $f_o$ is constant and L is variable.

Figure 9A:
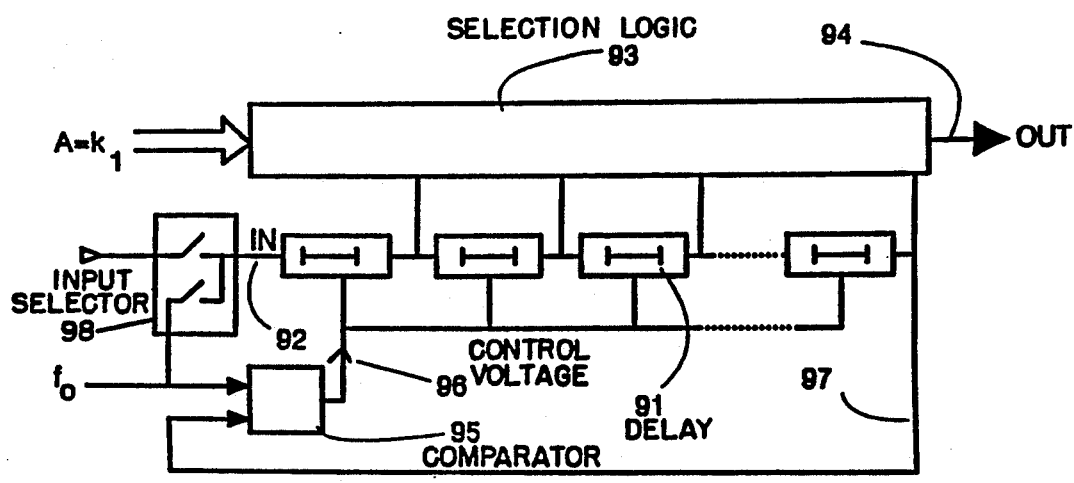
FIGS. 9a and 9b show a detail of the embodiment of FIGS. 5 and 6 which relates to the delay generation.
Figure 9B:
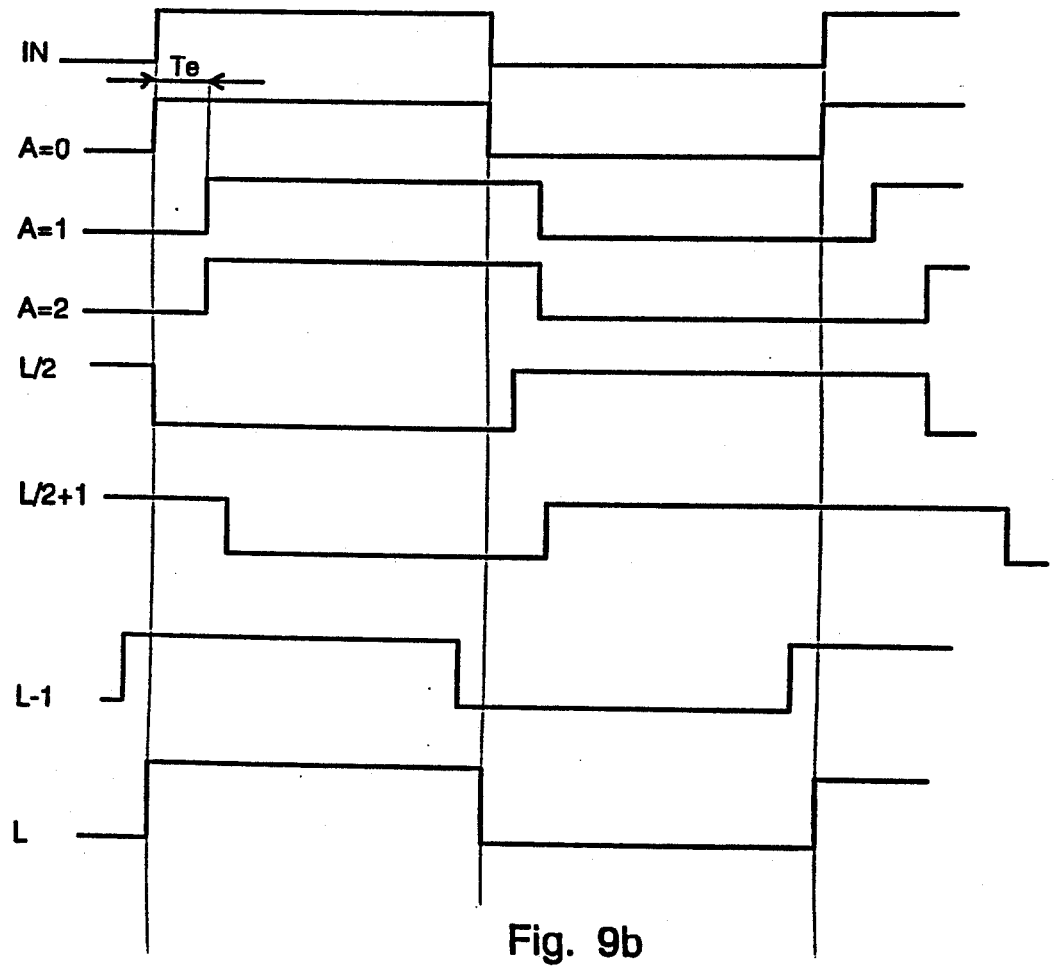

FIG. 9 shows a detail of the above presented solutions, in which a signal is multiplied by $L+\Delta L$, and in which the output pulse of a divider (e.g. the divider 71 in FIG. 7) is delayed by $k_1$ pulses of the multiplied frequency having the length of $(L+\Delta L)*f_o$, so that the $L+\Delta L$ delays 91 are synchronized together to have the length of $1/f_o$, and the pulse is then directed through $k_1$ such unit delays, so that the pulse is supplied to the input 92 of the delay chain and connected by the selection logic 93 to the output 94 from a unit delay output, which has the consecutive number $k_1$. More particularly the synchronization is provided by the comparison means 95 such that the length of each delay is controlled by the control voltage 96, so that the pulse edge is delayed exactly one period of $f_o$ before it reaches the delay chain's output. It is well known to add to this structure other parts required for the synchronization, such as the input selector 98, which directs the frequency $f_o$ to the delay chain's input during the synchronization of the delay chain.

I claim:

1. A method to realize a modulation using a frequency synthesizer based on a digital phase locked loop, in which synthesizer each pulse supplied to a phase comparator by a reference branch can be separately lengthened in a first lengthening means ($k_1$, $L+\Delta L$) by a first period of time, which corresponds to a first variable integer ($k_1$) number of first delay pulse periods, and in which each pulse supplied to the phase comparator by a voltage controlled oscillator (VCO) can be separately lengthened in a second lengthening means ($k_2$, L) by a second period of time, which corresponds to a second variable integer ($k_2$) number of second delay pulse periods, characterized in that while pulses are supplied to the phase comparator both the first integer and the second integer are each changed proportionally to a modulated signal such that the change of the first and second integers causes a change in a time difference of the pulses supplied to the phase comparator, the change in the time difference causing a change in an output signal ($f_x$) of the voltage controlled oscillator.

2. The method according to claim 1, characterized in that the first delay pulses are obtained by multiplying the output signal frequency ($f_x$) of the voltage controlled oscillator, possibly divided, by a first number ($L+\Delta L$), and that the second delay pulses are obtained by multiplying said output signal frequency of the voltage controlled oscillator by a second number (L), wherein the absolute value of the difference of said numbers is an integer, preferably 1.

3. The method according to claim 1, characterized in that
   the modulating signal comprises symbols comprising at least one bit and arriving at a predetermined rate,
   the change of the voltage controlled oscillator output signal is a phase shift of a predetermined size, and the modulation is a digital phase modulation.

4. The method according to claim 3, characterized in that the frequency of the pulses supplied to the phase comparator is N times a symbol rate of the modulating signal, where N is an integer equal to one or greater, and where the phase or frequency shift in the VCO output signal is realized in N steps so that a shift in the frequency or the phase of the output signal $f_x$, during a step, has a predetermined size.

5. The method according to claim 1, characterized in that
   a first delay frequency is generated by multiplying a reference signal frequency ($f_o$), which may be divided by an integer (I), by $L+\Delta L$, and
   a second delay frequency is generated by multiplying the reference signal frequency ($f_o$), which may be divided by an integer (I), by L, wherein an absolute value of the difference of said numbers is an integer, preferably 1.

6. The method according to claim 1, characterized in that
   two synthesizers are provided, each based on a digital phase locked loop designated (A) and (B), respectively, the two synthesizers are connected in parallel and have a common voltage controlled oscillator (VCO), and a VCO control voltage is a summation of a voltage provided by the A phased locked loop and a voltage provided by the B phased locked loop, whereby the addition uses for the B phased locked loop a weighting coefficient (G) which differs from a weighting coefficient of the A phased locked loop, and the voltage sum is connected to the common voltage controlled oscillator (VCO), wherein
   the first phase locked loop (A) generates a desired basic frequency, and
   in the second phase locked loop (B) a first variable integer ($l_1$) of the first lengthening means ($l_1$, $L_M+\Delta L_M$) and a second variable integer ($l_2$) of the second lengthening means ($l_2$, $L_M$) are changed proportionally to the modulating signal, whereby a change of the integers causes in the output signal of the voltage controlled oscillator (VCO) a phase or a frequency change, which change is attenuated by the coefficient G.

7. The method according to claim 6, characterized in that the first and second delay pulses of the phase locked loop B are generated from the voltage controlled oscillator (VCO) output signal ($f_x$), which may be divided by an integer (I), wherein the change in the phase or frequency of the output signal of the voltage controlled oscillator (VCO) is independent of the frequency $f_x$.

8. The method according to claim 6, characterized in that the first and second delay pulses of the phase locked loop B are generated from the reference frequency signal ($f_o$), wherein the change in the phase or frequency of the output signal of the voltage controlled oscillator (VCO) is proportional to the frequency $f_x$.

9. The method according to claim 6, characterized in that each pulse lengthening means of the phase locked loop A is controlled by a respective one of control means, the control means C1 and C2 being controlled by an external processor, and wherein each pulse lengthening means of the phase locked loop B is controlled by a respective one of control means (CM1, CM2), the control means CM1 and CM2 controlling the pulse lengthening means in accordance with momentary modulation information.

10. A circuit arrangement to realize a modulation using a frequency synthesizer based on a digital phase locked loop, which synthesizer has a first lengthening means ($k_1$, $L+\Delta L$) in which each pulse supplied to a phase comparator separately can be lengthened by a first period of time, which corresponds to a first variable integer ($k_1$) number of first delay pulse periods, and a second lengthening means ($k_2$, L) in which each pulse supplied to the phase comparator by a voltage controlled oscillator (VCO) can be separately lengthened by a second period of time, which corresponds to a second variable integer ($k_2$) number of second delay pulse periods, characterized in that said circuit arrangement further comprises modulation control means for changing the first ($k_1$) and the second ($k_2$) integer proportionally to a modulating signal such that a change of the integers causes a change of a time difference between the pulses supplied to the phase comparator, wherein the change in time difference causes a corresponding change in an output signal ($f_x$) of the voltage controlled 11. The circuit arrangement of claim 10, characterized in the modulating signal comprises symbols comprising at least one bit and arriving at a predetermined rate, the change of the voltage controlled oscillator output signal is a phase shift of a predetermined size, and the modulation is a digital phase modulation.

12. The circuit arrangement of claim 11, characterized in that the frequency of the pulses supplied to the phase comparator is N times a symbol rate of the modulating signal, where N is an integer equal to one or greater, and wherein the phase or frequency shift in the VCO output signal is accomplished in N steps.

13. The circuit arrangement of claim 10, characterized in that
said circuit arrangement comprises two synthesizers each of which includes a digital phase locked loop designated (A) and (B), respectively, the two synthesizers are connected in parallel and have a common voltage controlled oscillator VCO and an adder for generating a control voltage for said common VCO, said adder operating to add a first voltage provided by said phase locked loop (A) to a second voltage provided by said phase locked loop (B), said second voltage being weighted by a coefficient (G), wherein the phase locked loop (A) generates a desired basic frequency, and wherein the phase locked loop (B) comprises modulation control means (CM1, CM2) for changing a first variable integer ($l_2$) of the first lengthening means ($l_1$, $L_M+\Delta L_M$) and a second variable integer ($l_2$) of the second lengthening means ($l_2$, $L_M$) proportionally to the modulating signal, whereby a change of the integers causes in the output signal of the voltage controlled oscillator VCO a phase or a frequency change, which change is attenuated by the coefficient G.

14. The circuit arrangement of claim 10, characterized in that the lengthening means of the phase locked loop are coupled to the output ($f_x$) of the voltage controlled oscillator, wherein the change in the phase or frequency of the output signal of said voltage controlled oscillator is independent of the frequency $f_x$.

15. The circuit arrangement of claim 10, characterized in that the lengthening means of the phase locked loop are coupled to the reference frequency signal ($f_o$) branch, wherein the change of the phase or frequency of the output signal of said voltage controlled oscillator is proportional to the frequency $f_x$.

16. The circuit arrangement of claim 13, characterized in that each pulse lengthening means of the phase locked loop (A) is coupled to a respective one of control means (C1, C2), the control means C1 and C2 being controlled by an external processor, and wherein each pulse lengthening means of the phase locked loop (B) is coupled to a respective one of control means (CM1, CM2), the control means CM1 and CM2 controlling the pulse lengthening means in accordance with momentary modulation information.

17. The circuit arrangement of claim 16, characterized in that the modulation control ($k_1$, $k_2$), which generates the desired phase or frequency shift, is stored in control means (CM1, CM2).

* * * * *

UNITED STATES PATENT AND TRADEMARK OFFICE
CERTIFICATE OF CORRECTION

PATENT NO. : 5,325,075
DATED : June 28, 1994
INVENTOR(S) : Rapeli

It is certified that error appears in the above-identified patent and that said Letters Patent is hereby corrected as shown below:

In col. 13, claim 10, line 48, after the word "controlled" should appear the word --oscillator--.

Signed and Sealed this

Sixth Day of September, 1994

Attest:

BRUCE LEHMAN

Attesting Officer    Commissioner of Patents and Trademarks